United States Patent [19]

Montgomery

[11] 4,268,314

[45] May 19, 1981

[54] HIGH DENSITY REFRACTORY COMPOSITES AND METHOD OF MAKING

[75] Inventor: Lionel C. Montgomery, Bay Village, Ohio

[73] Assignee: Union Carbide Corporation, New York, N.Y.

[21] Appl. No.: 106,026

[22] Filed: Dec. 21, 1979

[51] Int. Cl.³ .............................................. C04C 35/58
[52] U.S. Cl. ..................................................... 106/65
[58] Field of Search .......................................... 106/65

[56] References Cited

U.S. PATENT DOCUMENTS

| | | | |
|---|---|---|---|
| 3,251,700 | 5/1966 | Mandorf | 106/65 |
| 3,376,247 | 4/1968 | Reddy et al. | 106/43 |
| 3,544,486 | 12/1970 | Passmore | 106/65 |
| 3,649,314 | 3/1972 | James | 106/43 |
| 3,813,252 | 5/1974 | Lipp | 106/65 |

OTHER PUBLICATIONS

Trontelj, M.; "Journal of Materials Sciences–1973", Letters pp. 136 & 137.
Trontelj, M.; "On the Mechanism of Reactive Sintering of AlN", pp. 39–48.

Primary Examiner—O. R. Vertiz
Assistant Examiner—Mark Bell
Attorney, Agent, or Firm—J. Hart Evans

[57] ABSTRACT

The density of hot pressed sintered refractory composites of AlN, $TiB_2$ and BN powder mixtures is improved by the addition of small amounts of nickel powder.

23 Claims, No Drawings

HIGH DENSITY REFRACTORY COMPOSITES AND METHOD OF MAKING

This invention relates to refractory composites made by hot pressing and sintering. More particularly it refers to an improved method of making refractory composites suitable for the manufacture of aluminum vaporization boats.

Aluminum foil coating manufacture is commonly accomplished by vaporizing aluminum held in a refractory container, or "boat" as it is commonly referred to in commercial practice. These boats are commonly manufactured from stock made by hot pressing and sintering powder mixtures. It has been known to make these boats from a sintered composite of $TiB_2$ and BN. The electrically conductive $TiB_2$ is balanced by the BN to increase electrical resistance.

The addition of AlN powder to $TiB_2$ powder or a mixture of $TiB_2$ and BN powders provides a mixture which upon sintering gives a material with good wettability to molten aluminum and improved strength. It has been suggested that the presence of BN makes the product more machineable. The density of the sintered composite material from which boats are made is quite important because aluminum will quickly attack the boat if the density is so low that the boat material is sufficiently porous for the aluminum to infiltrate. A density of at least 90 percent of theoretical is important to prevent such attack and a density of it least 93 percent of theoretical is preferred.

In commercial production hot pressing in a vacuum furnace is frequently employed to achieve the desired density. Vacuum furnacing also serves to remove any boron oxide present if the BN used in the mixture contains any, boron oxide being an undesired contaminant. The use of vacuum furnacing to achieve the desired high density greatly increases the cost and complexity of the manufacturing process and requires substantial investment in vacuum furnace equipment.

I have now discovered a means of avoiding the necessity of using vacuum equipment to achieve high density in a sintered refractory composite of AlN and $TiB_2$ in which BN may also br present. According to my invention there is added to the powder mixture before hot pressing a small amount of powdered nickel, the addition of nickel substantially increases the density of the sintered product where no vacuum processing is employed. As will be seen from the examples, densities in excess of 93 percent of theoretical have been consistently achieved. Additiion of nickel powder has been found to increase the flexual strength of the composite in most uses and to degrade it only slightly in others.

With the nickel present the mixture of powders of $TiB_2$ and AlN, with or without BN present, can be hot pressed directly at sintering temperatures. Or the material can be pressed at ambient temperature and then raised to sintering temperature, all without the use of a vacuum. Although the operating conditions are not considered a critical part of the present invention I have found a pressure from about 2200 to 3000 p.s.i. and a temperature of 1925° to 2000° C. most suitable for the hot pressing operation.

At least 0.5 weight percent of nickel powder should be added to the powder mixture with from 0.5 to 5 weight percent preferred. A preferred amount is about 1 percent by weight. Higher percentages of nickel do not give appreciable benefits and tend to decrease flexural strength. The powder mixture to which nickel powder is added according to the invention comprises, on a weight basis, from 20 to 60 percent AlN, 0 to 25 percent BN and from 40 to 80 percent $TiB_2$, a preferred composition comprises, on a weight basis, from 25 to 40 percent AlN, 20 to 25 percent BN and 40 to 50 percent $TiB_2$. A particularly preferred composition comprising, on a weight basis, about 33 percent AlN, about 22 percent BN and about 45 percent $TiB_2$. When the mixture is hot pressed and sintered without vacuum in the preferred form of the invention the BN should be substantially free of boron oxide.

As will be seen from the examples, the invention greatly increases the density of the composite product, usually by 15 percent or more. This is truly unexpected because published literature shows that when 1 weight percent of nickel powder is blended with AlN powder, cold pressed composites can be sintered at 2000° C. to essentially full densification, that is 99.5 percents of the theoretical density value. When no nickel is added the density is about 84.5 percent of theoretical, so that the density increase is equivalent to approximately 18 percent for AlN alone.

A preferred composition of the invention consisting, on a weight basis, of 33 percent AlN 22 percent BN are 45 percent $TiB_2$, can be best pressed to about 78 percent of theoretical density at a temperature 1975° C. under pressure of 2500 p.s.i. When 1 weight percent of nickel powder is blended with this mixture the hot pressed density of the composite formed from it is increased to about 96 percent of the theoretical value, equivalent to an increase of 23 percent. Considering that the composite contain only 33 percent AlN the expected density increase is only about 5 percent based on the rule of mixtures. The acutal 23 percent increase is entirely unexpected.

In the powder mixtures to which the present invention is applied the AlN powder particles normally have an average particle size of from 2 to 7 microns, with about 3 microns preferred. The $TiB_2$ particles are normally from 1 to 10 microns in average size with about 6 microns preferred. When boron nitride is present the average particle size is from 0.5 to 3 microns with about 1.5 microns preferred. The nickel powder added is usually from 1 to 3 micron in average particle with about 2 microns preferred. Size is not critical as long as the particles are small enough to mix evenly and thoroughly throughout the powder mixture.

EXAMPLE I

A powder mixture according to the prior art was prepared by blending together 33 weight percent AlN (3.0 micron average particle size), 22 percent boric oxide free BN (1.0 micron average particle size) and 45 percent $TiB_2$ (6.0 micron average particle size). Twenty pounds of this powder mixture were placed in a 6.3 inch diameter graphite mold fitted with a graphite plunger and the mixture was prepressed at ambient temperature to a pressure of 2000 pounds per square inch. The mold assembly was then heated at the rate of 300° C./hour by induction under a blanket of flowing argon gas to a temperature of 1975° C. under a pressure of 2500 pounds per square inch. It was then held at this temperature under this pressure for two hours. After the mold assembly was cooled to ambient temperature the billet was removed from the mold and its various properties were measured; they are listed in the table below.

A powder mixture according to the invention was the prepared which was identical to that described above except for the addition of 1 weight percent of powdered nickel of 1 micron average size. A billet was formed and hot pressed in the identical manner described above and its properties are listed in the table below.

| PROPERTIES | A | B |
|---|---|---|
| Percent Expansion, 25°-1800° | 1.8 | |
| Permanent Expanson (%) (cooled from 1800° to 25° C.) | 0.25 | 0.35 |
| Cracking Temperature, °C. | 2300+ | 2050 |
| Flexural Strength, p.s.i. | | |
| 25° C. | 13,800 | 9500 |
| 1000° C. | 12,500 | 5500 |
| Density % th. | 96 | 78 |
| Boat Life Hours 1.5 g/min/in$^2$ cavity (Al evap. rate) | 20 | 12 |

A: Composition according to the invention with nickel added.
B: Composition of the prior art without nickel The boat life at the end of the table of properties refers to a test wherein a cavity is formed in a piece cut from the billet to make a boat and aluminum is evaporated from it at the rate of 1.5 grams of aluminum per minute per square inch of cavity. The life of the boat under these conditions is then measured It can be noted that the density of the billets made with nickel was 23 percent greater than the density of the billets made without nickel, the expected increase for the percentage of AlN present would be only 5 percent.

EXAMPLE II

A powder mixture according to the prior art was prepared by blending together 20 weight percent AlN (3.0 micron average particle size), 20 percent boric oxide free BN (1.0 micron average particle size) and 60 percent TiB$_2$ (6.0 micron average particle size). One half pound of this powder mixture was placed in a 1.5 inch diameter graphite mold fitted with a graphite plunger and the mixture was prepressed at ambient temperature to a pressure of 2000 pounds per square inch. The mold assembly was then heated at the rate of 300° C./hour by induction under a blanket of flowing argon gas to a temperature of 1975° C. under a pressure of 2500 pounds per square inch. It was then held at this temperature under this pressure for two hours. After the mold assembly was cooled to ambient temperature the billet was removed from the mold and its various properties were measured.

A powder mixture according to the invention was then prepared which was identical to that described above except for the addition of 1 weight percent of powdered nickel of 1 micron average particle size. A billet was formed and hot pressed in the identical manner described above and its properties were measured. The billet with the nickel added had a density of 93.2 percent of theoretical, compared with only 80 percent for the control billet. This was an increase in density of 16.5 percent whereas the expected increase based on the percentage of AlN present would be only 2.8 percent, the flexural strength of the billet with nickel was 8514 pounds per square inch at 25° C. and 6028 pounds per square inch at 1000° C. while for the control billet without nickel the flexural strengths in p.s.i. was 6325 at 25° C. and 8081 at 1000° C.

EXAMPLE III

A powder mixture according to the prior art was prepared by blending together 55 weight percent AlN (3.0 micron average particle size), 5 percent boric oxide free BN (1.0 micron average particle size) and 40 percent TiB$_2$ (6.0 micron average particle size). One half pound of this powder mixture was placed in 1.5 inch diameter graphite mold fitted with a graphite plunger and the mixture was prepressed at ambient temperature to a pressure of 2000 pounds per square inch. The mold assembly was then heated at the rate of 300° C./hour by induction under a blanket of flowing argon gas to a temperature of 1975° C. under a pressure of 2500 pounds per square inch. It was then held at this temperature under this pressure for two hours. After the mold assembly was cooled to ambient temperature the billet was removed from the mold and its various properties were measured.

A powder mixture according to the invention was then prepared which was identical to that described above except for the addition of 1 weight percent of powdered nickel of 1 micron size. A billet was formed and hot pressed in the identical manner described above and its properties were measured. The billet with the nickel added had a density of 94.4 percent of theoretical, compared with only 81.5 percent for the control billets. This is an increase in density of 15.8 percent whereas the expected increase based on the percentage of AlN present would be only 7.7 percent. The flexural strength of the billet with nickel was 22976 pounds per square inch at 25° C. and 19513 at 1000° C. while for the control billet without nickel the flexural strengths in p.s.i. was 19698 at 25° C. and 19131 at 1000° C.

EXAMPLE IV

A powder mixture according to the prior art was prepared by blending together 33 weight percet AlN (3.0 micron average particle size), 22 percent boric oxide free BN (1.0 micron average particle size) and 45 percent TiB$_2$ (6.0 micron average particle size). One half pound of his powder mixture was placed in 1.5 inch diameter graphite mold fitted with a graphite plunger and the mixture was prepressed at ambient temperature to a pressure of 2000 pounds per square inch. The mold assembly was then heated at the rate of 300° C./hour by induction under a blanket of flowing argon gas to a temperature of 1975° C. under a pressure of 2500 pounds per square inch. It was then held at this temperature under this pressure for two hours. After the mold assembly was cooled to ambient temperature the billet was removed from the mold and its various properties were measured.

These powder mixtures according to the invention were then prepared which was identical to that described above except for the addition of powdered nickel of 1 micron average particle in the amounts of 1 weight percent, 3 weight percent and 5 weight percent respectively. Billets were formed and hot pressed in the identical manner described above their properties were measured.

The billet with 1 percent nickel added had a density of 96.5 percent of theoretical, compared with only 82.7 percent for the control billet. This was an increase in density of 16.7 percent whereas the expected increase based on the percentage of AlN present would be only 5 percent. The billet with 3 percent nickel had a density 94.5 percent for a 14.3 percent increase while the billet with 5 percent nickel had a density of 95.0 for 14.9 percent increase.

The flexural strength of the billet with 1 percent nickel added was 11057 pound per square inches 25° and 14660 p.s.i. at 1000° C. while for the control billet without nickel the flexural strength was 9800 p.s.i. at 25° C. and 9745 p.s.i. at 1000° C. For the billet with 3 percent nickel added the strength was 6229 p.s.i. at 25° C. and 9414 p.s.i. at 1000° C. The billet with 5 percent nickel added had a flexural strength of 8485 p.s.i. at 25° C. and 9207 p.s.i. at 1000° C.

What is claimed is:

1. In a method of processing a mixture consisting essentially of AlN, TiB$_2$ and BN powders by pressing and heating to form a high density sintered refractory composite, the improvement which consists of adding to said mixture at least 0.5 weight percent of nickel powder.

2. Method according to claim 1 wherein there is added from 0.5 to 5 weight percent of nickel powder.

3. Method according to claim 1 wherein there is added about 1 weight percent of nickel powder.

4. Method according to claim 1, 2 or 3 wherein said processing comprises hot pressing and sintering.

5. Method according to claim 1, 2 or 3 wherein said processing comprises cold forming under pressure and retaining said pressure while heating to sintering temperature.

6. Method according to claim 4 wherein a vacuum is not employed.

7. Method according to claim 5 wherein a vacuum is not employed.

8. Improved composition suitable for forming a high density sintered refractory composite, said composition consisting essentially of a mixture of, on a weight basis, from 20 to 60 percent AlN, 5 tp 25 percent BN and from 40 to 80 percent TiB$_2$, with at least 0.5 weight percent of nickel powder added to said mixture.

9. Composition according to claim 8 consisting essentially of, on a weight basis, from 25 to 40 percent AlN, 20 to 25 percent BN and from 40 to 50 percent TiB$_2$, with from 0.5 to 5 weight percent of nickel powder added.

10. Composition according to claim 8 consisting essentially of, on a weight basis, about 33 percent AlN, about 22 percent BN and about 45 percent TiB$_2$, with about 1 percent of nickel powder added.

11. Composition according to claim 8, 9 or 10 wherein said BN is substantially free of boron oxide.

12. A sintered refractory composite having a density of at least 90 percent of theoretical made by sintering a mixture consisting essentially of, on a weight basis, from 20 to 60 percent AlN, 5 to 25 percent BN and from 40 to 80 percent TiB$_2$, with at least 0.5 weight percent of nickel powder added to said mixture.

13. A sintered refractory composite according to claim 12 made from a mixture consisting essentially of, on a weight basis, from 25 to 40 percent AlN, 20 to 25 percent BN and from 40 to 50 percent TiB$_2$, with from 0.5 to 5 weight percent of nickel powder added.

14. A sintered refractory composite according to claim 12 made from a mixture consisting essentially of, on a weight basis, about 33 percent AlN, about 22 percent BN and about 45 percent TiB$_2$, with about 1 percent of nickel powder added.

15. A sintered refractory composite according to any one of claims 12, 13 and 14 and having a density of at least 93 percent of theoretical.

16. A sintered refractory composite according to any one of claims 12, 13 and 14 wherein said BN is substantially free of boron oxide.

17. A sintered refractory composite according to claim 14 wherein said BN is substantially free of boron oxide.

18. A high density sintered refractory composite boat useful for the vaporization of aluminum made by sintering a mixture consisting essentially of, on a weight basis, from 20 to 60 percent AlN, 5 to 25 percent BN and from 40 to 80 percent TiB$_2$, with at least 0.5 weight percent of nickel powder added to said mixture.

19. A composite boat according to claim 18 made from a mixture consisting essentially of, on a weight basis, from 25 to 40 percent AlN, 20 to 25 percent BN and from 40 to 50 percent TiB, with from 0.5 to 5 weight percent of nickel powder added.

20. A composite boat according to claim 18 made from a mixture consisting essentially of, on a weight basis, about 33 percent AlN, about 22 percent BN and about 45 percent TiB$_2$, with about 1 percent of nickel powder added.

21. A composite boat according to claim 18, 19, or 20 and having a density of at least 93 percent of theoretical.

22. A composite boat according to claim 18, 19 or 20 wherein said BN is substantially free of boron oxide.

23. A composite boat according to claim 21 wherein said BN is substantially free of boron oxide.

* * * * *